United States Patent [19]

Tsunaga et al.

[11] Patent Number: 5,248,451

[45] Date of Patent: * Sep. 28, 1993

[54] ELECTRICALLY CONDUCTIVE COPPER COMPOSITION

[75] Inventors: Masayuki Tsunaga, Ina; Takao Suzuki, Urawa; Kazuaki Yuba, Ageo; Yoshiaki Kurimoto; Kyoichi Gokan, both of Takasaki; Masaki Hirosawa, Kitakyushu, all of Japan

[73] Assignees: Mitsui Mining & Smelting Co., Ltd., Tokyo; Gunei Chemical Industry Co., Ltd., Gunma, both of Japan

[ * ] Notice: The portion of the term of this patent subsequent to Sep. 3, 2008 has been disclaimed.

[21] Appl. No.: 727,552

[22] Filed: Jul. 9, 1991

[30] Foreign Application Priority Data

Jul. 16, 1990 [JP] Japan .................. 2-187371

[51] Int. Cl.$^5$ ............................................. H01B 1/06
[52] U.S. Cl. ............................ 252/512; 252/514; 524/439; 524/440
[58] Field of Search ................ 252/500, 512, 514; 524/439, 440

[56] References Cited

U.S. PATENT DOCUMENTS 5,045,236  9/1991  Tsunaga et al. .................. 252/514

FOREIGN PATENT DOCUMENTS 64-34597  2/1989  Japan .

OTHER PUBLICATIONS

English language abstract of Japanese Patent No. 64-34597 Feb. 6, 1989.

Primary Examiner—Mark L. Bell
Assistant Examiner—Paul Marcantoni
Attorney, Agent, or Firm—Flynn, Thiel, Boutell & Tanis

[57] ABSTRACT

The present invention provides a conductive copper composition comprising metal powder, a binder, a dispersant, and a solvent, characterized by containing 100 parts by weight of copper powder in the form of spherical or granule particles coated with silver as the metal powder, 6 to 18 parts by weight of resol resin satisfying the following conditions (a) to (c) as the binder, 0.05 to 1 part by weight of the dispersant, and 2 to 15 parts of the solvent:

(a) Dimethylene-ether bonds in the skeletal structure or alkyl-ether bonds are contained 5% more of the bonded formaldehyde;

(b) The molar ratio of preparation between formaldehyde and phenol (formaldehyde/phenol) is within the range of 1.0 to 3.0; and (c) Components making up the resin having polystyrene-converted molecular weight of below 700, equal to and larger than 700 and less than 7,000, and equal to and larger than 7,000, measured from the ratio of the areas of the pattern obtained by the Gel Permeation chromatography, are contained therein in amounts of 20% to 60%, 40% to 70%, and 0 to 30%, respectively.

10 Claims, No Drawings

ELECTRICALLY CONDUCTIVE COPPER COMPOSITION

BACKGROUND OF THE INVENTION a) Field of the Invention

This invention relates to an electrically conductive polymer type copper composition for use in forming film circuits, and more particularly to a conductive copper composition having a good solderability as well as a high conductivity formed by using copper powder in spherical or granular particles coated with silver as a metal powder and a resol-type phenolic resin as a binder.

b) Description of the Prior Art

Good solderability is required for conductive polymer type copper compositions used in forming film circuits in order to facilitate soldering of lead wires, pins, and the like. A conductive copper composition having its solderability taken into consideration is known from Japanese Patent Provisional Publication gazette No. 34597/1989. The composition of the invention disclosed by the gazette comprises metal powder, a resol resin, a saturated or unsaturated fatty acid, or a metal salt thereof, a metal chelate forming agent, and a soldering accelerating agent. This formulation provides the composition with a good solderability by the addition of the metal chelate forming agent for inhibiting oxidation of the metal powder and the soldering accelerating agent.

However, there are problems with such compositions heretofore proposed, such as the one mentioned above, that they require the addition of antioxidants for inhibiting the oxidation of metal powder and a soldering accelerating agent and that their electrical conductivity is not sufficient, despite their good solderability, while and the solderability of compositions proposed with principal regard to the conductivity is not sufficient. Thus, there are no compositions which both conductivity and solderability required for formed film. Accordingly, circuit patterns must be formed by the combined use of compositions with good conductivity and compositions with good solderability, or by plating printed patterns of copper paste with a metal by means of electroless deposition.

The former method requires extra steps which make the process more complicated and increase the cost, while the latter method has the problem of the disposal of waste liquid which causes a substantial cost increase.

SUMMARY OF THE INVENTION

The object of the present invention is to provide a conductive copper composition which can form films having both a good conductivity and solderability. The present invention provides a conductive copper composition comprising metal powder, a binder, a dispersant, and solvent, and is characterized by containing 100 parts by weight of copper powder in the form of spherical or granule particles coated with silver as the metal powder, 6 to 18 parts by weight of a resol resin satisfying the following conditions (a) to (c) as the binder, 0.05 to 1 part by weight of the dispersant, and 2 to 15 parts of the solvent:

(a) Dimethylene-ether bonds in the skeletal structure or alkyl-ether bonds are contained in an amount of 5% or more of the bonded formaldehyde;

(b) The molar ratio of formaldehyde and phenol (formaldehyde/phenol) is within the range of 1.0 to 3.0; and (c) Components with polystyrene-converted molecular weights of below 700 (hereinafter referred to as component A), from 700 to below 7,000 (hereinafter referred to as component B), and above 7,000 (hereinafter referred to as component C) are contained in the resin in an amount of 20% to 60%, 40% to 70%, and 0 to 30% respectively as determined from the ratio of the areas of the pattern obtained by the Gel Permeation chromatography.

DETAILED DESCRIPTION OF THE INVENTION

The embodiments of the present invention are described below in detail.

The copper powder used for the composition of this invention is preferably in the form of spherical or granular particles. The average particle size of the copper powder is preferably 2 to 20 $\mu$m. If the average particle size is below 2 $\mu$m, oxidation and solder leaching become noticeable. On the other hand, if the average particle size is above 20 $\mu$m, the composition is prone to clog the mesh of screens when silk screened. The more preferable average particle size is 5 to 10 $\mu$m. This copper powder is coated with silver by the so called EDTA acidic bath method. The copper powder is dispersed in a solution of a chelate; forming agent; next, a silver ion solution is added with stirring; then a reducing agent is added. The ratio of the weight of silver to the total weight of the silver-coated copper powder is preferably 0.5% to 5%. If the amount of silver is less than 0.5%, oxidation of the copper powder become a problem. On the other hand, if the amount of silver is greater than 5%, silver-caused problems, such as solder leaching and migration, arise in addition to an increase of the cost. The more preferable silver content is 1% to 3% by weight.

The binder used by the present invention is a resol resin which is obtained by the addition condensation of a phenol and formaldehyde and satisfies the following conditions.

(1) Dimethylene-ether bonds ($-CH_2-O-CH_2-$) are contained in the skeletal structure, or methylol groups are replaced by alkyl-ether bonds ($-CH_2-O-R$).

(2) Dimethylene-ether bonds or alkyl-ether bonds make up 5% or more of the bonded formaldehyde.

(3) The molar ratio between formaldehyde and phenol (formaldehyde/phenol) is within the range of 1.0 to 3.0.

(4) The components A, B, and C, measured from the ratio of the areas of the pattern obtained by the GPC method, are 20% to 60%, 40% to 70%, and 0 to 30%, respectively. Here, the component A is the part whose polystyrene-converted molecular weight is below 700, the component B is the part whose polystyrene-converted molecular weight is from 700 to below 7,000, and the component C is the part whose polystyrene-converted molecular weight is above 7,000.

The phenolic derivatives used as the raw material of the resol resin used by the present invention are phenol, cresol, xylenol, ethyl phenol, trimethyl phenol, propyl phenol, butyl phenol, octyl phenol, dihydroxybenzene, naphtol derivatives, and bisphenol derivatives, for example. These phenol derivatives may be used individually or in a mixture.

As described above, the resol resin used by the present invention as the binder has either dimethylene-ether bonds in the skeletal structure or alkyl-ether bonds resulting from the conversion of methylol into alkyl ether and make up 5% or more of the bonded formaldehyde.

Here, bonded formaldehydes include formaldehydes which bond to phenol derivatives and have structures such as methylol ($-CH_2OH$), methylene ($-CH_2-$), dimethylene-ether ($-CH_2-O-CH_2-$), alkyl-ether ($-CH_2-O-R$), and hemiacetal ($-(CH_2O)_n-H$).

If the resin contains 5% or more dimethylene-ether bonds or alkyl-ether bonds, the resol resin has a high solubility in rosin flux and hence has a satisfactory solderability. It also has good flexibility and adhesion properties. If the bond content below 5%, the resin's solubility in rosin flux is low and, consequently, its solderability and the flexibility are unsatisfactory.

On the other hand, a too large dimethylene-ether bond or alkyl-ether bond content causes insufficient hardening due to a shortage of functional groups which take part in cross linkage. Therefore, a more preferable dimethylene-ether bond content is 15% to 45%. A more preferable content of alkyl-ether bonds is also 15% to 45%.

There are various types of alkyl groups which can be used in converting methylol into an alkyl ether. They are straight chain, secondary, and tertiary in structure and higher and lower with respect to the number of carbon atoms. Although there is no limit on the type of alkyl group usable for this invention, the straight chain alkyl groups with 1 to 4 carbon atoms are preferable.

With respect to the molar ratio between formaldehyde and phenol (formaldehyde/phenol) used in the reaction, a preferable ratio is within the range of 1.0 to 3.0. As the molar ratio increases beyond 3.0, the strength of the film decreases due to the decrease in molecular weight and insufficient hardening of the synthesized resin. If the molar ratio is smaller than 1.0, the cross linking density as well as the dimethylene-ether bond or alkyl-ether bond content decreases. Thus, a more preferable molar ratio of preparation between formaldehyde and phenol (formaldehyde/phenol) is within the range of 1.0 to 2.5, both for resins with dimethylene-ether bonds and for resins with alkyl-ether bonds.

Further, the molecular weight of the resol resins used in the composition of the present invention is determined by the following findings. Of the three components A, B, and C defined as above and measured from the GPC pattern, component A consists of low molecular-weight resin molecules and the dimethylene-ether bond or alkyl-ether bond content of the A component is larger than that of the other components. If component A is above 20% of the whole resin, a film formed by this composition has a good solderability because of a large dimethylene-ether bond or alkyl-ether bond content. On the other hand, components B and C consist of middle molecular-weight resin molecules and high molecular weight resin molecules, respectively. Therefore, the dimethylene-ether bond or alkyl-ether bond content of components B and C is smaller than that of component A. If the component B is above 70% or the component C is above 30% of the whole resin, the solderability of the composition becomes unsatisfactory. However, the molecular weight of the resin affects not only solderability, but also other characteristics such as electrical conductivity and adhesion. Therefore, the molecular weight distribution is determined taking into consideration the effect on those characteristics as well. If component A consisting of low molecular-weight molecules exceeds 60% of the whole resin, the strength, hardening, and adhesion are unsatisfactory. Therefore, a larger content of component B and component C are required. Based on this consideration, the suitable molecular distribution are defined as component A, 20% to 60%, component B, 40% to 70%, and component C, 0% to 30%.

The aforementioned molecular weight of the resol resin is the value measured by the GPC method using reference polystyrene. The measurement was conducted by connecting a G300H×t column from Tosoh Co., and two Tosoh G2000H×t columns in series to a Tosoh HLC-8020 chromatograph and letting tetrahydrofuran as the carrier media flow at a velocity of 0.8 ml/min. A differential refractometer is used for detection. The molecular weight is determined from a working curve drawn by the cubic regression using Tosoh reference polystyrene (nine samples of weight-average molecular weight $7.91 \times 10^5$, $3.54 \times 10^5$, $9.89 \times 10^4$, $1.01 \times 10^4$, $6.4 \times 10^3$, $2.8 \times 10^3$, $9.5 \times 10^2$, and $5.3 \times 10^2$) and styrene monomer.

The binder may be a single type of resin or a mixture of two or more types of resins. It is also intended that if a mixture of two or more types of resin satisfies all the requirements, the mixture is included in the scope of this invention even though each individual resin does not meet all the conditions by itself. The binder is added in a amount of 6 to 18 parts by weight to 100 parts by weight of the silver a hyphen coated copper powder. If the amount of binder is below 6 parts by weight, the electrical conductivity, the strength of the hardened film, and the adhesion strength decrease to unsatisfactory values. If the amount of binder is above 18 parts by weight, the solderability and the electrical conductivity become unsatisfactory.

The composition of the present invention comprises silver-coated copper powder and a binder as principal components and a dispersant and a solvent. In addition, a defoaming agent, a leveling agent, or a thixotropic agent may be added.

For the dispersant of the present invention, organic titanate compounds are preferable, and are organic compounds in which a hydrophilic group and a lipophilic group are bonded to a titanium atom at the center in a so; called titanate coupling. These titanate compounds are divided by hydrophilic groups into four types: monoalkoxy type (those which have an isopropoxy group); first chelate type (those which have an oxyacetate residue); second chelate type (those which have an ethylene glycol residue); and coordinate type (tetraalkyl titanate with a phosphorous ester added). Of the above four types, the monoalkoxy type is most effective. These organic titanate compounds coordinate or are adsorbed onto the surface of the silver-coated copper powder to improve the dispersibility of the silver-coated copper powder into the binder during kneading. The effect of improvement of the dispersibility is remarkable, especially when the copper powder content of the composition is considerably high as in the composition of the present invention. To form a film with a good solderability, not only must there be a large amount of copper powder on the surface of the film, but also the copper powder must be distributed evenly.

Therefore, it is possible to form a film with a good solderability by the addition of organic titanate compounds to improve the dispersibility of the copper cupper powder during kneading. These dispersants are added in an amount of 0.05 to 1 parts by weight to 100 parts by weight of the silver-coated copper powder. If the dispersants are less than 0.05 parts by weight, the electrical conductivity and the solderability become unsatisfactory. If the dispersants are above 1 part-by-weight, the adhesion becomes unsatisfactory.

For the solvents, polyhydric alcohol derivatives such as butyl cellosolve, dibutyl cellosolve, methyl carbitol, ethyl carbitol, butyl carbitol, dibutyl carbitol, butyl cellosolve acetate, methyl cellosolve acetate, ethyl cellosolve acetate, and butyl cellosolve acetate are preferable. These polyhydric alcohol derivatives are good solvents of resol resins. They also prevent volatilization of solvents during printing. Further, only small amounts of them remain in printed film during curing. These solvents are added in an amount of 2 to 15 parts by weight to 100 parts by weight of the silver insert a hyphen coated copper powder. If the solvents are below 2 parts by weight, silk screened patterns become uneven. If the solvents are above 15 parts by weight, silk screened patterns blur. The electrical conductivity and the solderability also decrease to become unsatisfactory.

The composition prepared as described above is applied to boards to form circuit patterns by conventional methods such as silk screening, and then heated to cure.

Further, since the present invention uses silver coated copper powder as metal powder, the composition of the present invention has the following advantages. Conventionally, for conductive copper compositions used for forming film which does not need a good solderability, reducing agents are added to them to prevent oxidation of the copper powder in the film formed. However, for those used for forming film which needs a good solderability, as much copper powder as possible is filled and the density of the copper powder near the surface of the film is raised by various methods. Consequently, the copper powder is placed in easily oxidized conditions and therefore addition of reducing agents alone are not enough to prevent the oxidation of the copper powder. However, since the present invention covers the surface of each particle of copper powder with a thin silver layer, oxidization of the copper powder can be prevented notwithstanding the high filling rate of copper powder. Further, the film formed by this composition has a very good conductivity and solderability.

Furthermore, since the present invention uses silver; coated copper powder in the form of spherical or granule particles, the composition of the present invention also has the following advantages. Conventionally, dendritic or flaky copper powder is used in conductive copper compositions used as conductive copper pastes. Because of the shapes of the copper powder particles, the density of the binder in the paste becomes larger at the surface side of hardened film than at the board side to hinder soldering and hence decrease the solderability of the film. On the other hand, since this invention uses copper powder in the form of spherical or granular particles, the binder in the paste moves toward the board side by the middle phase of hardening process after being printed and a smaller density of the binder is left at the surface of the hardened film. The binder layer over the copper powder then becomes thinner than that formed when using dendritic or flaky copper powder. Consequently, it can be readily removed by the solvent action of a soldering flux. There are two more advantages due to using copper powder in the form of spherical or granular particles.

1) The copper powder particles can slide smoothly on each other. Consequently, the composition of the present invention is easy to be printed notwithstanding the high filling rate of the copper powder.
2) The specific surface area of the copper powder is smaller. Consequently, the amount of silver required to be coated on the surface of the copper particles becomes so much smaller.

Finally, since the present invention uses a resol resin which satisfies the conditions (a) to (c) below simultaneously as the binder, a thin layer of the binder over the silver-coated copper powder is dissolved by flux during soldering at a high temperature and fresh surfaces of the silver-coated copper powder are exposed, and thus the solderability of the film formed by the composition of the present invention is significantly improved.

(a) Dimethylene-ether bonds in the skeletal structure or alkyl-ether bonds are contained in an amount of 5% or more of the bonded formaldehyde.
(b) The molar ratio of preparation between formaldehyde and phenol (formaldehyde/phenol) is within the range of 1.0 to 3.0.
(c) The components A, B, and C defined in polystyrene-converted molecular weight and determined from the ratio of the corresponding areas of the pattern obtained by the GPC method are contained in the resin in an amount of 20% to 60%, 40% to 70%, and 0 to 30% respectively.

The present invention thus provides an electrically conductive copper composition which has a high-conductivity, a good solderability, and a strong adhesion.

Hereinafter described are examples of the composition of the present invention and their test results.

The compositions of examples 1 to 4 and comparative examples 1 to 5 were prepared by kneading 100 parts by weight of copper powder in the form of granular particles with average particle size of 8 $\mu$m coated with 2 wt % of silver, 10 parts by weight of a resol resin from Gun'ei Chemical Co.,) as a binder, 0.1 parts of a dispersant (organic titanate compound KR-TTS from Ajinomoto Co.,), and 7 parts by weight of a solvent (methyl carbitol) in a three-roll mill.

These compositions were then silk screened on a paper phenolic substrate (1.6 mm in thickness) through 200-mesh Tetron screen and hot cured at 160° C. for 30 minutes in an air oven.

The thus formed films were tested for solderability, specific resistance, and adhesion strength. The test methods for these characteristics were as follows.

(1) Solderability

A 2 mm×2 mm square pattern was used. Flux No. 366 from Multicore Co., was applied to the film. After having been preheated on a hot plate at 150° C. for 20 seconds, the board was dipped in eutectic solder bath for 3 seconds and pulled up. The solderability of the film was then graded as below blow.

| Solderability | Percentage of the area covered by solder |
| --- | --- |
| ○ | 100% |
|   | 80% to 99% |

$$T = F/4$$

TABLE 1

|  | Ex. 1 | Ex. 2 | Ex. 3 | Ex. 4 |
| --- | --- | --- | --- | --- |
| Binder | GM-3 | GM-4 | GM-5 | GM-5M |
| Phenols | Phenol | Phenol | Phenol | Phenol |
| Skeletal structure | Dimethylene-ether bond | Dimethylene-ether bond | Butyl-ether bond | Butyl-ether bond |
| Percentage in bonded formaldehyde (%) | 40 | 15 | 35 | 35 |
| Molecular weight (%) |  |  |  |  |
| (Ratio of areas) |  |  |  |  |
| Component A (%) | 35 | 23 | 35 | 28 |
| Component B (%) | 64 | 54 | 46 | 70 |
| Component C (%) | 1 | 23 | 19 | 2 |
| Molar ratio of preparation | 2.0 | 2.0 | 1.3 | * |
| Remarks |  |  |  | Fract. from GM-5 |
| Solderability | O | O | O | O |
| Specific resistance ($\times 10^{-4} \Omega \cdot$ cm) | 2.4 | 2.7 | 3.7 | 4.3 |
| Adhesion strength (kg/mm$^2$) | 1.3 | 1.2 | 1.4 | 1.3 |

|  | Com. Ex. 1 | Com. Ex. 2 | Com. Ex. 3 | Com. Ex. 4 | Com. Ex. 5 |
| --- | --- | --- | --- | --- | --- |
| Binder | GM-4S | GM-4L | GM-5S | GM-5L | GM-2 |
| Phenols | Phenol | Phenol | Phenol | Phenol | Phenol |
| Skeletal structure | Dimethy-lene-ether bond | Dimethy-lene-ether bond | Butyl-ether bond | Butyl-ether bond | Methylene-methylol bond |
| Percentage in bonded formaldehyde (%) | 50 | 2-3 | 70 | 2-3 |  |
| Molecular weight |  |  |  |  |  |
| (Ratio of areas) |  |  |  |  |  |
| Component A (%) | 73 | 2 | 66 | 2 | 47 |
| Component B (%) | 27 | 50 | 34 | 43 | 53 |
| Compenent C (%) | 0 | 48 | 0 | 55 | 0 |
| Molar ratio of preparation | * | * | * | * | 1.5 |
| Remarks | Fract. from GM-4 | Fract. from GM-4 | Fract. from GM-5 | Fract. from GM-5 |  |
| Solderability | O | X | O | X | X |
| Specific resistance ($\times 10^{-4} \Omega \cdot$ cm) | 6.4 | 2.0 | 7.3 | 2.3 | 1.4 |
| Adhesion strength (kg/mm$^2$) | 0.6 | ** | 0.5 | ** | ** |

*The molar ratio is not shown as the binder was fractionated from another binder.
**The adhesion strength could not be measured because the film surface was not covered with solder at all.

| Solderability | Percentage of the area covered by solder |
| --- | --- |
| X | Less than 80% |

(2) Specific Resistance

A 1 mm×200 mm line pattern was used. The electrical resistance R (Ω) between the opposite ends and the average film thickness of line t (μm) were measured. Then, the specific resistance of the film ρ (Ω·cm) was calculated by the following equation.

$$\rho = \frac{R \times t}{200} \times 10^{-4}$$

(3) Adhesion Strength

A 2 mm×2 mm square pattern was used. The sample obtained by the test for solderability was used as it was, and a 0.8 mm φ tinned soft copper wire was soldered upright at the center of each square film with wire solder and a soldering iron. Next, 90° pull tests were performed using a tension tester to measure the load F (kg) when the film peels off. Then, the adhesion strength T (kg/mm$^2$) was calculated by the following equation.

COMPOSITION OF EXAMPLE 1

Since this composition uses copper powder with an average particle size of 8 μm coated with 2 wt % silver as the metal powder and a resol-type phenolic resin with a molar ratio of preparation of 2 containing 40% dimethylene-ether bonds and consisting of 35% A component, 64% B component, and 1% C component as the binder and since their compounding ratio is appropriate, the film formed of this composition has a very good solderability, a low specific resistance, and a high adhesion strength.

COMPOSITION OF EXAMPLE 2

Because of the same appropriate properties of the metal powder and the binder as example 1 and their proper compounding ratio, the film formed of this composition has a very good solderability, a low specific resistance, and a high adhesion strength.

COMPOSITION OF EXAMPLE 3

Since this composition uses the same copper powder as examples 1 and 2 as the metal powder and a resol resin with the molar ratio of preparation of 1.3 containing 35% butyl-ether bonds and consisting of 35% A component, 46% B component, and 19% C component as a the binder and their compounding ratio is appropriate, the film formed of this composition also has a very good solderability, a low specific resistance, and a high adhesion strength.

COMPOSITION OF EXAMPLE 4

Because of the same appropriate properties of the metal powder and the binder as example 3 and their proper compounding ratio, the film formed of this composition has a very good solderability, a low specific resistance, and a high adhesion strength.

COMPOSITION OF COMPARATIVE EXAMPLE 1

This composition uses GM-4S, which is the low molecular-weight composition fractionated from GM-4, used as the binder of example 2. Although the film formed of this composition has a very good solderability, since a resol resin containing 50% dimethylene-ether bonds is used, it has a large specific resistance and a low adhesion strength since the composition A content is larger than the upper limit and the composition B content is smaller than the lower limit.

COMPOSITION OF COMPARATIVE EXAMPLE 2

This composition uses GM-4L, which is the large molecular-weight composition fractionated from GM-4, which was used as the binder of example 2. Since the ratio of dimethylene-ether bonds is smaller than the lower limit, the film formed of this composition has a poor solderability.

COMPOSITION OF COMPARATIVE EXAMPLE 3

This composition uses GM-5S, which is the low molecular-weight composition fractionated from GM-5 which was used as the binder of example 2. Although the film formed of this composition has a very good solderability, since the resol resin containing 70% butyl-ether bonds, it has a large specific resistance and a low adhesion strength since the composition A content is larger than the upper limit and the composition B content is smaller than the lower limit.

COMPOSITION OF COMPARATIVE EXAMPLE 4

This composition uses GM-5L, which is the large molecular-weight composition fractionated from GM-5 which was used as the binder of example 3. Since the ratio of butyl-ether bonds is smaller than the lower limit, the film formed of this composition has a poor solderability.

COMPOSITION OF COMPARATIVE EXAMPLE 5

A resol resin which has methylene-methylol bonds is used as the binder and the film formed of this composition has a poor solderability.

What is claimed is:

1. A conductive copper composition comprising metal powder, a binder, a dispersant and a solvent, said metal powder consisting of copper powder coated with silver in an amount of from 0.5 to 5% by weight, based on the weight of the metal powder, and is contained in said conductive copper composition in an amount of 100 parts by weight, said copper powder being in the shape of spheres or granules, said binder comprising 6 to 18 parts by weight, with respect to the conductive copper composition, of a resol resin formed by the addition condensation reaction of a phenol with formaldehyde, said formaldehyde being reacted with said phenol in a molar ratio of formaldehyde/phenol of 1.0 to 3.0, 5% or more of the bonds formed between the formaldehyde and the phenol being dimethylene-ether bonds or alkyl ether bonds, said resol resin containing three fractions with different molecular weight ranges, fraction A having a molecular weight below 700 and making up from 20% to 60% of the resol resin, fraction B having a molecular weight from 700 to below 7000 and making up from 40% to 70% of the resol resin and fraction C having a molecular weight of 7000 or larger and making up from 0 to 30% of the resol resin, said dispersant being present in said conductive copper composition in an amount of 0.05 to 1 part by weight and said solvent being contained in the copper composition in an amount of from 2 to 15 parts by weight.

2. A conductive copper composition in claim 1, in which the average particle size of said copper powder is from 2 to 20 $\mu$m.

3. A conductive copper composition in claim 1, in which the average particle size of said copper powder is from 5 to 10 $\mu$m.

4. A conductive copper composition in claim 1, in which said silver is from 1 to 3 wt % of said metal powder.

5. A conductive copper composition in claim 1, in which the dimethylene-ether or alkyl-ether bond content is from 15% to 45%.

6. A conductive copper composition in claim 1, in which the molar ratio of formaldehyde/phenol, is within the range of 1.0 to 2.5.

7. A conductive copper composition in claim 1, in which said dispersant comprises an organic titanate compound.

8. A conductive copper composition in claim 1, in which said solvent comprises a polyhydric alcohol derivative.

9. A conductive copper composition in claim 1, additionally comprising a member selected from among an anti-foaming agent, an leveling agent, and an thixotropic agent.

10. A conductive copper composition in claim 4, in which said silver is coated the copper powder by the EDTA acidic bath method.

* * * * *

UNITED STATES PATENT AND TRADEMARK OFFICE
CERTIFICATE OF CORRECTION

PATENT NO. : 5 248 451
DATED : September 28, 1993
INVENTOR(S) : Masayuki TSUNAGA et al It is certified that error appears in the above-identified patent and that said Letters Patent is hereby corrected as shown below:

Column 10, line 48; delete ",".
        line 61; after "coated" insert ---on---.

Signed and Sealed this

Tenth Day of May, 1994

Attest:

BRUCE LEHMAN

Attesting Officer     Commissioner of Patents and Trademarks